(12) United States Patent
Van De Kerkhof et al.

(10) Patent No.: US 7,443,485 B2
(45) Date of Patent: *Oct. 28, 2008

(54) APODIZATION MEASUREMENT FOR LITHOGRAPHIC APPARATUS

(75) Inventors: Marcus Adrianus Van De Kerkhof, Helmond (NL); Haico Victor Kok, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 496 days.

This patent is subject to a terminal disclaimer.

(21) Appl. No.: 11/220,389

(22) Filed: Sep. 7, 2005

(65) Prior Publication Data

US 2006/0055906 A1    Mar. 16, 2006

Related U.S. Application Data

(63) Continuation-in-part of application No. 10/935,741, filed on Sep. 8, 2004, now Pat. No. 7,315,353.

(51) Int. Cl.
*G03B 27/54* (2006.01)
*G03B 27/72* (2006.01)

(52) U.S. Cl. .......................................... 355/67; 355/71
(58) Field of Classification Search ................. 355/52, 355/53, 55, 67–71; 250/548; 356/399–401
See application file for complete search history.

(56) References Cited

U.S. PATENT DOCUMENTS

| | | | |
|---|---|---|---|
| 6,710,856 B2 * | 3/2004 | Van Der Laan et al. | 355/71 |
| 7,224,430 B2 * | 5/2007 | Dierichs | 355/53 |
| 7,315,353 B2 * | 1/2008 | Van De Kerkhof et al. | 355/69 |
| 2002/0001088 A1 | 1/2002 | Wegmann et al. | |

* cited by examiner

*Primary Examiner*—Hung Henry Nguyen
(74) *Attorney, Agent, or Firm*—Pillsbury Winthrop Shaw Pittman, LLP

(57) ABSTRACT

A method and apparatus are provided for measuring the apodization of projection optics for use in a lithographic apparatus, the projection optics having an object plane where, in use, a reticle is placed, a pupil plane, and an image plane where, in use, a wafer is placed. The method includes placing one or more Appropriate apertures in said object plane for creating a substantially uniform light distribution, illuminating the or each aperture and measuring the intensity distribution at a plane which is conjugate to the pupil plane in order to calculate the apodization of the projection optics.

20 Claims, 6 Drawing Sheets

APODIZATION MEASUREMENT FOR LITHOGRAPHIC APPARATUS

RELATED APPLICATIONS

The present application is a Continuation-in-Part Application of application Ser. No. 10/935,741, filed Sep. 8, 2004, now U.S. Pat. No. 7,315,353 the entire contents of which is hereby incorporated by reference.

BACKGROUND OF THE INVENTION

1. Field of the Invention

The present invention relates to an apparatus and method for apodization measurement in a lithographic apparatus.

2. Background of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

We first discuss here some background concerning lens apodization.

Lens light non-uniformity is in general characterized in the image plane. Very tight specifications are used in order to limit CD-variations (critical dimension variations) through the image field. When light non-uniformity appears in the pupil plane, (e.g. over the various angles at image level), CD-variations through pitch are expected. Light non-uniformity in the pupil is often referred to as apodization. In this sense, apodization describes the amplitude part of the pupil-transmission function (where aberrations describe the phase part of the pupil transmission function). A uniform pupil transmission is often assumed, but this is generally not the case.

Below we give a definition of lens apodization and its relation to pupil measurement. Next we give an overview of the different types of apodization and their impact on imaging.

Mathematically imaging can be described by two Fourier transforms: one from the object plane to the pupil plane and one from the pupil plane to the image plane. Prior to the second Fourier transform, the pupil distribution is multiplied by the OTF (optical transfer $$I(\vec{x}) = \int_{\vec{p}} OTF(\vec{x}, \vec{p}) \cdot \left[ \int_{\vec{x}'} O(\vec{x}') \cdot e^{2\pi i \cdot \vec{x}' \cdot \vec{p}} \right] \cdot e^{-2\pi i \cdot \vec{x} \cdot \vec{p}}$$

function) of the imaging system.

Here, I and O equal the E-fields in the image and object planes as function of the field co-ordinates $\vec{x}$, and pupil co-ordinates $\vec{p}$. In order to obtain the image intensity, the amplitude of the E-field needs to be squared.

The OTF can be split into a phase term W (describing the aberrations)

$$OTF(\vec{x}, \vec{p}) = A(\vec{x}, \vec{p}) \cdot e^{-2\pi i \cdot W(\vec{x}, \vec{p})}$$

and an apodization term A (describing the apodization). Both are a function of the pupil co-ordinate $\vec{p}$, and vary over the field with field co-ordinates $\vec{x}$.

Next we turn to an apodization definition. Apodization is defined as the angular lens transmission. The apodization function A(r) can be decomposed into several classes of functions. In analogy with aberrations Zernike polynomials $Z_n(\vec{p})$ and the corresponding Zernike coefficients $z_n(\vec{x})$ are an appropriate decomposition.

$$A(\vec{x}, \vec{p}) = \sum_n z_n(\vec{x}) \cdot Z_n(\vec{p})$$

These Zernike coefficients have no dimension, representing the transmission of the corresponding Zernike polynomial at the pupil-edge.

In line with the assumption of uniform lens transmission, lens apodization is currently typically not measured directly. Various components of it are part of or influence other measurements. E.g. the uniform pupil transmission $Z_1$ (x) is part of the uniformity measurement.

Current pupil measurements at wafer-level measure a combination of the illumination angular intensity and the lens apodization. No separation is made between lens and illuminator effects. This can be dangerous since both induce different imaging effects.

To understand the impact on imaging, one has to look at the diffraction pattern of the object. In general, large objects have small diffraction patterns, while small objects have large diffraction patterns. Diffraction patterns are (in general) symmetric; the amplitude of the positive diffraction orders is equal to the amplitude of the negative diffraction orders.

Odd apodizations affect the telecentricity of the light at wafer level. Telecentricity equals the mean pointing (i.e. mean direction) of the imaging beam. In this way it affects overlay as a function of focus. That is to say, for odd apodizations more light reaches a given point on the wafer (image plane) from one side than from the other, with the result that if the wafer is moved up or down with respect to the image plane (thus defocusing the exposed image) the image effectively moves horizontally.

Even apodizations (for which the light intensity reaching a given point on the wafer (image plane) is symmetrical about a line perpendicular to the wafer) affect the optimal exposure dose as a function of structure density (pitch) and orientation. Thus it results in CD variations through pitch; lines of different pitch generally require a different exposure dose to be printed at the same size.

As a special case, astigmatic apodization introduces an energy difference between horizontal and vertical lines.

Apodization appears within the lens pupil. Thus it can only be measured with a pupil sensor. One can use e.g. a pinhole sensor scanning at large defocus, or a parallel detector array, conjugate with the pupil plane. All such sensors contain optical interfaces and/or may not be perfectly conjugate with the pupil and thus need to be corrected for geometrical effects as well as angular transmission effects (Fresnel coefficients).

In an optical context conjugate points are points on the optical axis of an optical system, such as a lens or mirror, so positioned that light emitted from either point will be focused at the other, e.g. object and image points. By extension, conjugate planes are planes normal to the optical axis of an optical system so positioned that light emitted from points in either plane will be focused at the other, e.g. object and image planes.

Next one has to realize a known pupil filling at object level. This can be either realized by calibrating or measuring a well-defined intensity distribution, or by use of a theoretically known intensity distribution such as given by a perfect pinhole, with a diameter small with respect to the wavelength used.

U.S. 2002/0001088 (corresponding to WO 01/63233 in the name of Carl Zeiss) describes an apparatus for wavefront detection which includes an optical system for transforming a wavefront, a diffraction grating through which the wavefront passes, and a spatially resolving detector following the diffraction grating. FIG. 1 of the Zeiss patent shows the layout of the apparatus, in which light from a source 43 passes through a movable light guide 29, a perforated mask 8, lenses 13 and 15, and a moveable diffraction grating 11 before reaching a detector 19 which comprises a sensor surface 20. The apparatus of the Zeiss patent can be used for the measurement of lens aberration. The function of the grating 11 is to convert phase effects (caused by aberrations) to amplitude effects, which are then measured by the detector 19. In the Zeiss patent scanning is also required because it is necessary to separate x and y components. The scanning allows one component to be averaged out so that the other can be measured.

SUMMARY OF THE INVENTION

According to the invention, there is provided a method of measuring the apodization of projection optics for use in a lithographic apparatus, the projection optics having an object plane where, in use, a reticle is placed, a pupil plane, and an image plane where, in use, a wafer is placed, the method including placing one or more appropriate apertures in said object plane for creating a substantially uniform light distribution, illuminating the or each aperture, and measuring the intensity distribution at a plane which is conjugate to the pupil plane in order to calculate the apodization of the projection optics.

In certain embodiments, said plane which is conjugate to the pupil plane corresponds to a plane which is out-of-focus with respect to the image plane such that a far field imaging condition applies with respect to said pupil plane.

Said apertures may be an array of apertures.

In certain embodiments, the apertures of said array are arranged in a quasi-random or random manner.

The or each aperture may have a diameter smaller than the wavelength of radiation used, a diameter approximately equal to the wavelength of the radiation used, or a diameter greater than the wavelength of the radiation used.

The method may include further performing a calibration to establish the intensity profile of light emitted from the aperture or apertures.

The calibration may be performed off-line.

The method may include placing a diffuser over the or each aperture to diffuse the light reaching the or each aperture.

The method may include placing one or more apertures at the image plane of said projection optics for creating a substantially uniform light distribution, placing a sensor behind said one or more apertures seen from the projection lens in a plane out of focus with respect to the image plane of said projection optics, and calibrating the angular sensitivity of said sensor.

The invention also provides an apparatus for measuring the apodization of projection optics for use in a lithographic apparatus, the projection optics having an object plane where, in use, a reticle is placed, a pupil plane, and an image plane where, in use, a wafer is placed, the apparatus including one or more appropriate apertures located in said object plane for creating a substantially uniform light distribution, an illuminator for illuminating the or each aperture and a light measuring sensor for measuring the intensity distribution at a plane which is conjugate to the pupil plane in order to calculate the apodization of the projection optics.

In certain embodiments, said plane which is conjugate to the pupil plane corresponds to a plane which is out-of-focus with respect to the image plane such that a far field imaging condition applies with respect to said pupil plane.

The apertures of the apparatus may be an array of apertures, and may be arranged in a quasi-random or random manner.

The or each aperture may have a diameter smaller than the wavelength of radiation used, a diameter approximately equal to the wavelength of the radiation used, or a diameter greater than the wavelength of the radiation used.

The intensity profile of light emitted from the aperture or apertures may be calibrated.

The apparatus may be provided with a diffuser over the or each aperture to diffuse the light reaching the or each aperture.

The apparatus may be provided with one or more apertures located between said projection optics and said sensor for calibrating the angular sensitivity of said sensor.

The invention also provides a lithographic apparatus including an illumination system for providing a projection beam of radiation, a support structure for supporting a patterning device, the patterning device serving to impart the projection beam with a pattern in its cross-section. a substrate table for holding a substrate, and projection optics for projecting the patterned beam onto a target portion of the substrate. The lithographic apparatus further including a system for measuring the apodization of the projection optics, the projection optics having an object plane where, in use, a reticle is placed, a pupil plane, and an image plane where, in use, said substrate is placed, the apparatus including one or more appropriate apertures located in said object plane for creating a substantially uniform light distribution, and a light measuring device for measuring the intensity distribution at a plane which is conjugate to the pupil plane in order to calculate the apodization of the projection optics.

In certain embodiments, said plane which is conjugate to the pupil plane corresponds to a plane which is out-of-focus with respect to the image plane such that a far field imaging condition applies with respect to said pupil plane.

The apparatus may be provided with one or more apertures located between said projection optics and said sensor for calibrating the angular sensitivity of said sensor.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (LV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
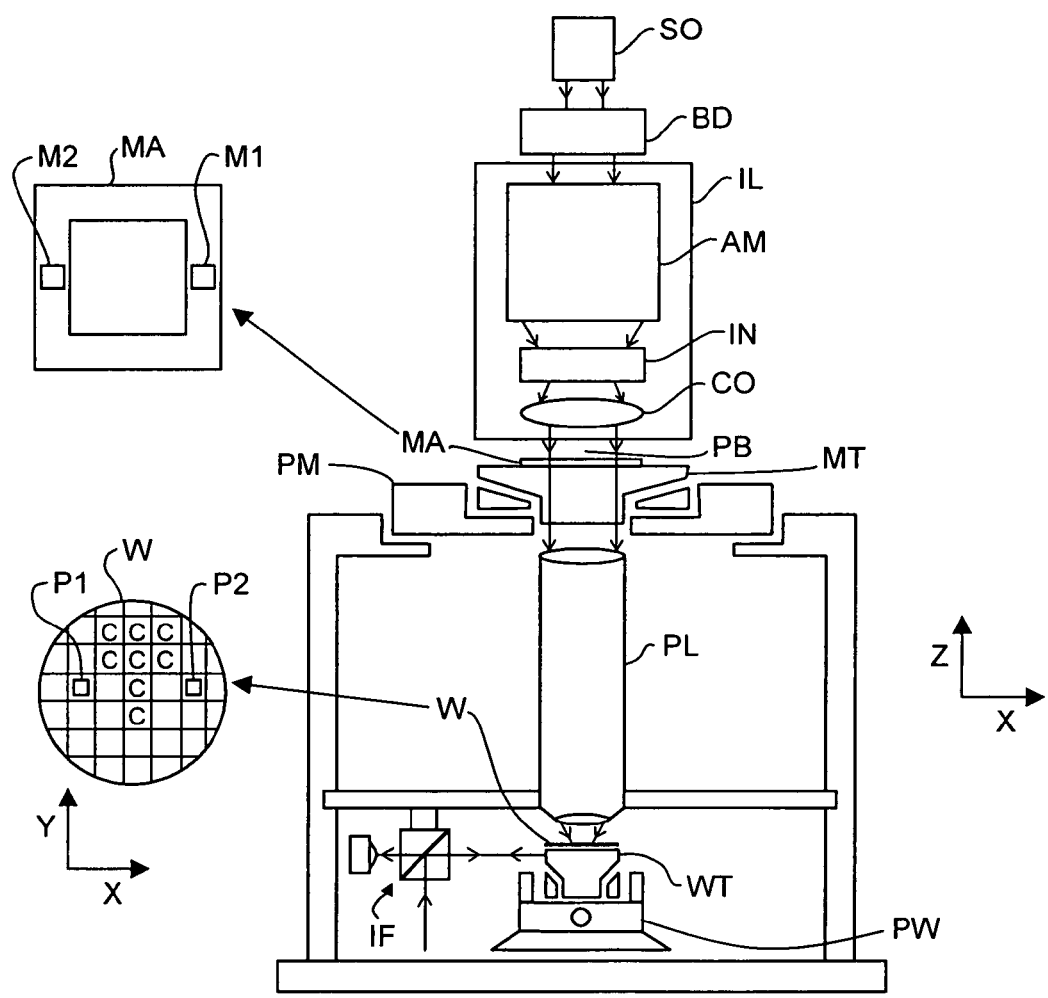
FIG. 1 shows a lithographic apparatus comprising a projection lens, the apodization of which can be measured using the present invention.

FIG. 1 schematically depicts a lithographic apparatus in which the invention may be employed. The apparatus comprises:
an illumination system (illuminator) IL for providing a projection beam PB of radiation (e.g. DUV or EUV radiation).
a first support structure (e.g. a mask table) MT for supporting a patterning device (e.g. a mask) MA and connected to first positioner PM for accurately positioning the patterning device with respect to item PL;
a substrate table (e.g. a wafer table) WT for holding a substrate (e.g. a resist-coated wafer) W and connected to second positioning device PW for accurately positioning the substrate with respect to item PL; and
a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable elements AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioner PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

We now turn to measurement of apodization.

The angular distribution of the light exiting the Projection Lens can be measured by a sensor such as the TIS or ILIAS. However, to measure the transmission of the Projection Lens a source is needed with a uniform or predetermined angular distribution of the light. The Illuminator cannot provide such a uniform illumination.

In state-of-the-art lithographic apparatus several in-situ techniques are used to measure the pupil intensity distribution, such as a scanning pinhole out-of-focus, or a parallel detector array, effectively conjugate with the pupil plane.

Measurement and control of the pupil shape is becoming critical for scanner performance at low k1-factors, where k1 is the ratio between CD (Critical Dimension) and wavelength divided by NA (Numerical Aperture).

Looking at the optical system of FIG. 1 rigorously, in both techniques mentioned above the measured pupil intensity distribution is the product of the projection lens transmission as a function of the pupil plane coordinates (referred to in this specification as apodization) and the illuminator intensity profile.

In terms of imaging, these two components have a distinctive effect, since the lens transmission function is imaged coherently, while the illuminator profile is imaged incoherently. The present measurement techniques however, cannot distinguish between these contributions. Furthermore, in state-of-the-art lithography apparatus the sensor used for measuring the pupil intensity distribution shows an angular sensitivity which may influence an accurate measurement of the pupil shape.

For existing systems, to a good approximation the lens transmission can be assumed to be uniform over the entire pupil. In the near future, however, ultra-high NA systems will generally require explicitly separated measurements of illuminator profile and apodization.

The above-mentioned explicit separation of illuminator profile and apodization can be accomplished straightforwardly by realizing an intensity distribution at object level (see pinhole 2 in FIG. 2) with a known or calibrated angular intensity distribution. Furthermore, calibration of the sensor can be accomplished by realizing an intensity distribution at image level (see pinhole 16 in FIG. 6) with a uniform or predetermined angular intensity distribution. This is outlined in more detail below.

Figure 2:
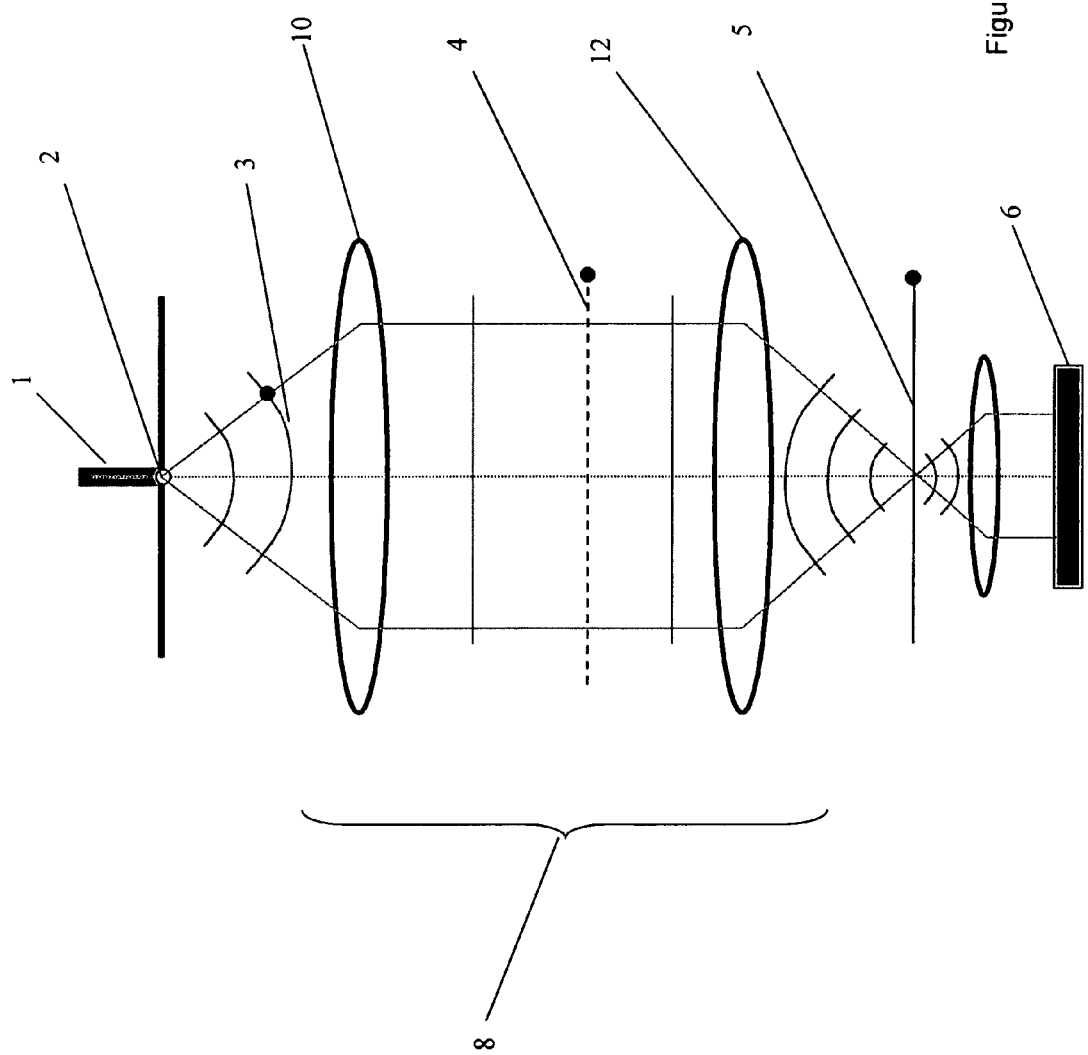
FIG. 2 shows an overview of the measurement system of the present invention.

FIG. 2 shows an overview of the measurement system, which is used for measuring the apodization of the projection lens PL of the lithographic apparatus of FIG. 1.

FIG. 2 shows the incoming beam 1 from an illuminator, a pinhole 2 at reticle level, a uniform spherical wavefront 3 emerging from pinhole 2, the pupil plane 4, the image plane 5, and a photodiode array 6 which acts as a camera for measuring light intensity. The projection lens PL of FIG. 1 is represented in FIG. 2 schematically as projection optics 8 including a first lens 10 and a second lens 12. The pupil plane 4 is where the apodization of the projection optics 8 is assumed to occur mathematically. The image plane 5 corresponds with the plane of the wafer W in FIG. 1. The pinhole 2 can be realized e.g. by creating an open area with high transmittance in a highly absorbing chrome or dielectric layer; this open area should have dimensions well below the wavelength used to act as a true point source. Such a point source has an intensity distribution which is effectively uniform over the range of solid angles present within the lens pupil.

Figure 3:
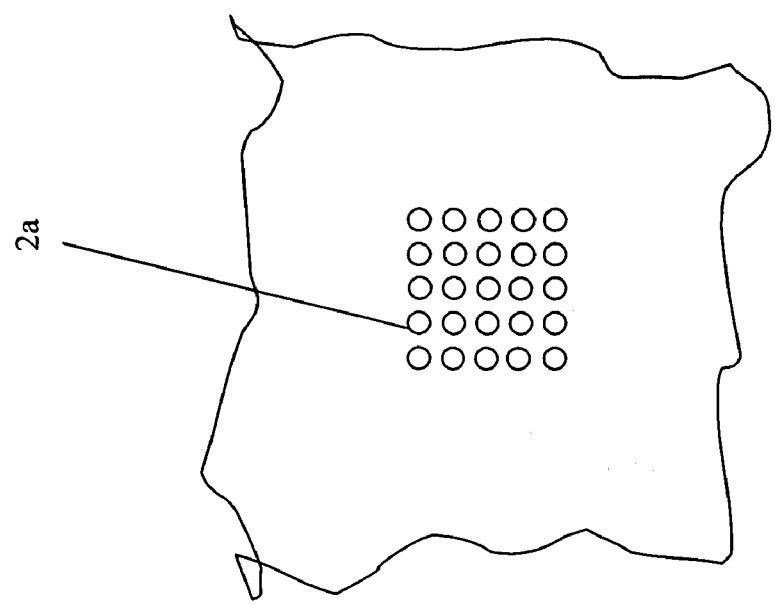
FIG. 3 shows the use of an array of pinholes.
Figure 3:
Figure 3:
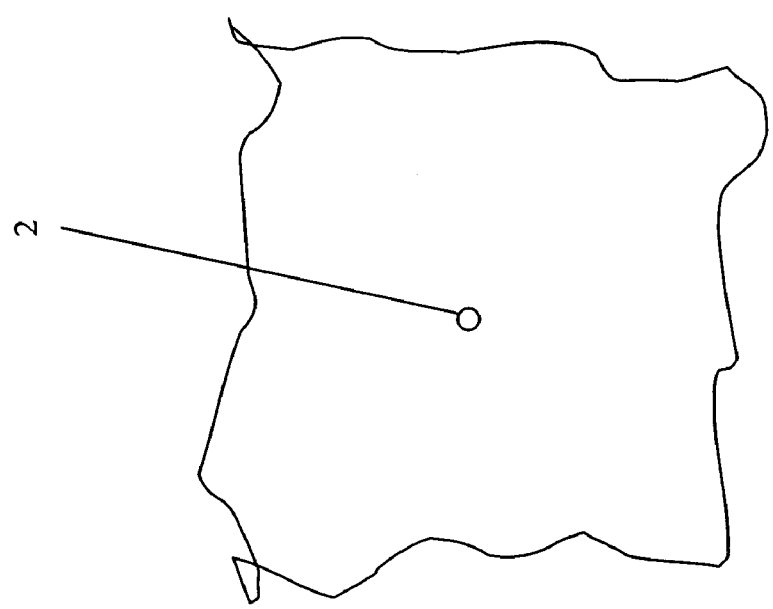

As shown in FIG. 3, the pinhole 2 may be replaced by an extended array of small 'true point sources' 2a (by which we mean sources each having a diameter smaller than the wavelength used), where each point source 2a has a uniform intensity distribution (as a result of diffraction at the point source). By extending the array of sources the loss of transmission due to the very small open area per point source is (partly) compensated for. Because these point sources 2a add up incoherently for a detection device which is effectively conjugate to the pupil plane, in principle no resolution is sacrificed by extending the array.

Transmission can be enhanced by using an n×n array of pinholes, which increases the effective transmission by a factor of n×n. The exact pinhole shape does not matter, just the critical dimension (i.e. diameter) which should be below the wavelength. The array layout is also not critical, but the structures should be close to each other (within ~0.1 mm) to avoid blurring.

Figure 4:
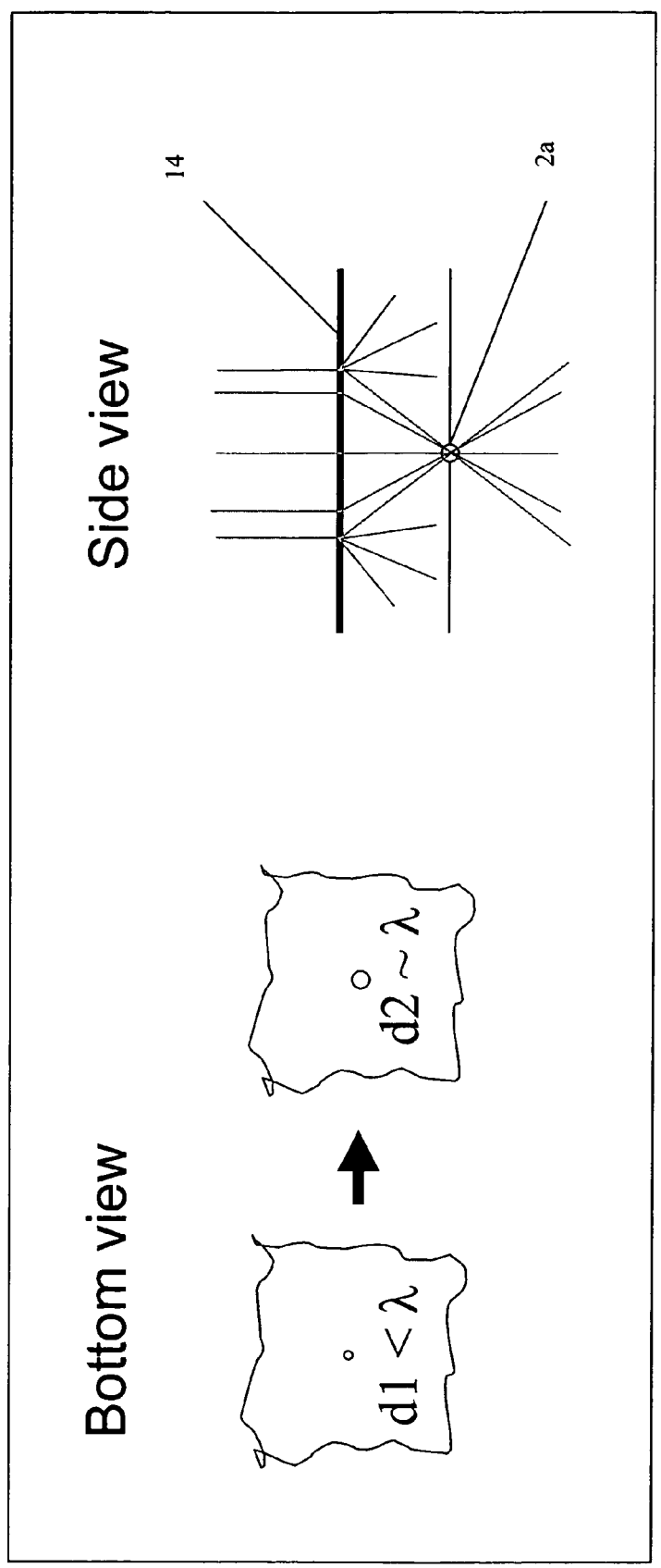
FIGS. 4 and 5 shows the use of a diffuser above the pinhole or array of pinholes.

A second embodiment, illustrated by FIG. 4, is to boost the effective transmission of the above-mentioned 'true point sources' 2a by combining an array of sufficiently small open areas with a strong diffuser 14 to further equalize the intensity distribution over all solid angles within the pupil plane 4. In this way, the dimensions of the open area per 'point source' can be increased as illustrated at the left of FIG. 4 where the increase in diameter from d1 to d2 is shown. In FIG. 4, d1 represents a true point source (diameter smaller than wavelength), whereas d2 represents a "weak point source" (diameter of the same order as the wavelength) which needs the use of the strong diffuser 14 to ensure a uniform intensity distribution. The use of point sources of larger diameter increases the overall intensity and also relaxes the reticle lithography requirements in conformance to state-of-the-art reticle lithography (200-300 nm). This greatly facilitates manufacturing actual Source Modules (being the modules where the effective source is located) at minimal Cost-of-Goods.

Figure 5:
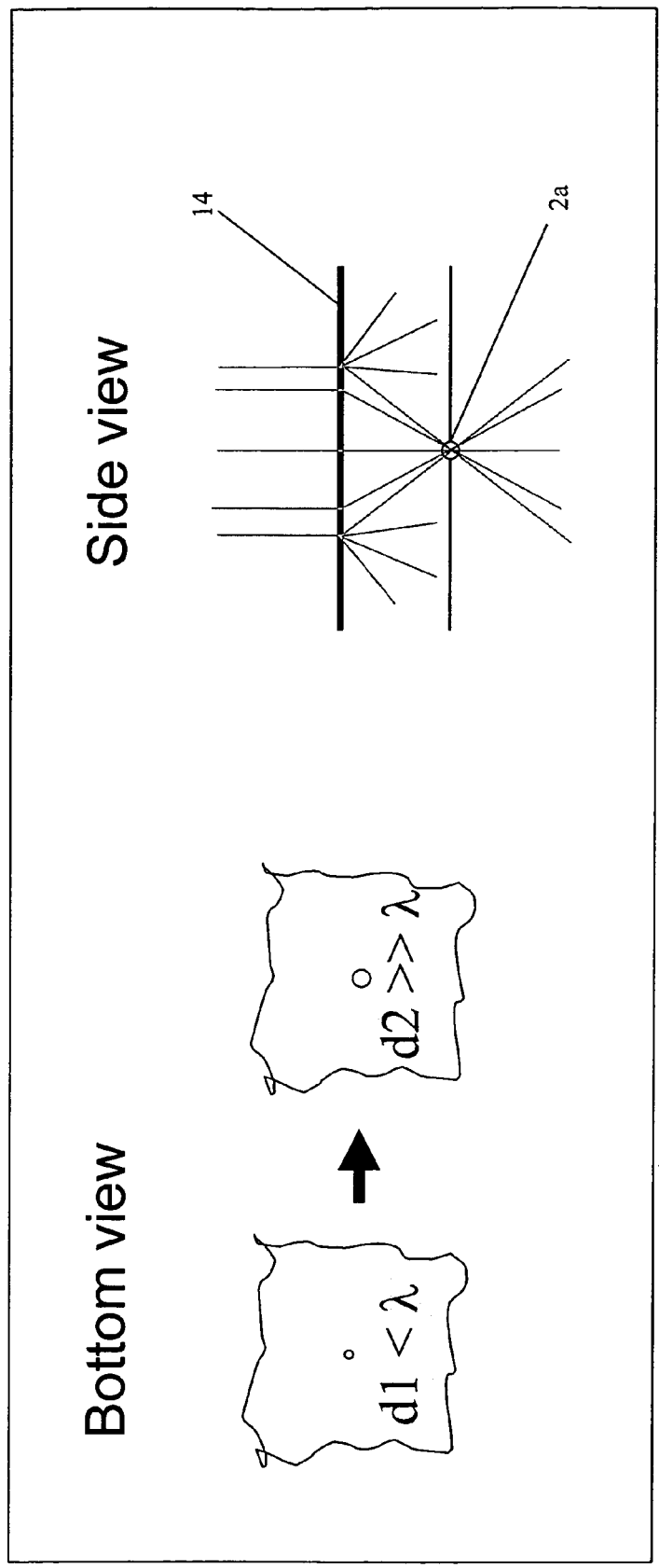

A third embodiment, shown in FIG. 5, is to use a 'weak point source', with dimensions larger than the used wavelength (represented by the aperture on the left of FIG. 5 having diameter d2), and to calibrate the intensity distribution against that of a 'true point source' (with the drawback of low transmission), for example on a system which has a surplus of intensity for pupil measurements (e.g. a high-throughput 248 nm lithographic apparatus). In this embodiment the point source diameter (d2) is increased so much compared to that of a true point source (d1) that its intensity distribution needs to be calibrated even when used with the strong diffuser 14. The resulting calibration data can be connected to the now-calibrated Source Module by various methods.

The calibration process is basically an (off-line) comparison of the object distribution over all angles, as resulting from this "weak point source", against the essentially perfect distribution of a "true point source". In such a calibration a number of drawbacks of in-line applications can be avoided, in particular the lack of intensity, timing constraints and perhaps also the difficulty of creating a true point source in the available volume.

Using the 'weak point source' of FIG. 5, the overall intensity is boosted significantly, but at the expense of a loss of the intrinsic intensity uniformity of a 'true point source'. This drawback is solved by the (once-only) calibration.

Alternatively, this calibration of the intensity distribution at object level of a given Source Module can be done outside of the lithographic apparatus, on a calibrated measurement tool or by comparison against a perfect reference Source Module.

The third embodiment of FIG. 5 may use an array of such weak point sources, in which case the calibration is carried out for the intensity distribution of the whole array.

Figure 6:
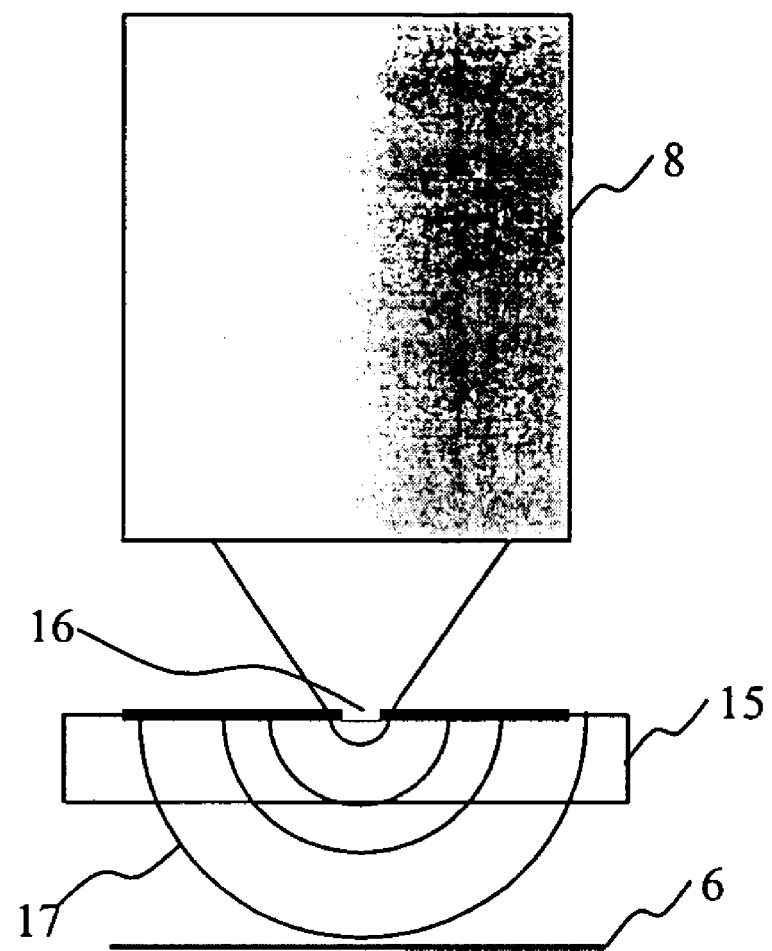
FIG. 6 shows another embodiment of a measurement system according to the present invention.

FIG. 6 shows a fourth embodiment which is used for calibrating the angular sensitivity of the photodiode array 6. This embodiment comprises projection optics 8, a quartz plate 15 located at image level provided with a pinhole 16 and photodiode array 6 comprising m×m elements located in a plane which is out-of-focus with respect to the image plane. The pinhole 16 can be realized e.g. by creating an open area with high transmittance in a highly absorbing chrome or dielectric layer on a glass substrate; this open area should have dimensions well below the wavelength used to act as true point sources. Such a point source has an intensity distribution which is effectively uniform over the range of solid angles present within the lens pupil.

Transmission can be enhanced by using an n×n array of pinholes, which increases the effective transmission by a factor of n×n. The exact pinhole shape does not matter, just the critical dimension (i.e. diameter) which should be below the wavelength. The array layout is also not critical, but the structures should be close to each other (within ~0.1 mm) to avoid blurring.

In operation the pinhole 16 transmits a uniform spherical wavefront 17 to the photodiode array 6. The process of calibrating the angular sensitivity of the photodiode array 6 comprises measurement of the uniform spherical wavefront and storage of the measured intensities of the m×m photodiode elements as a function of position in a memory. Typically, this calibration needs to be performed only once. The stored intensities of the m×m photodiode elements are used for correcting the subsequent pupil intensity distribution measurements with the angular sensitivity differences of the sensor.

The invention also offers a further improvement to any of the embodiments described above which use an array of pinholes. This further improvement comprises arranging the pinholes in a quasi-random or random array. Simply arranging the pinholes in a regular fashion (on some grid) may create unwanted discrete diffraction orders and thus lead to a non-uniform distribution.

However, by placing a relatively large number of pinholes on a quasi-random grid these diffraction orders are avoided. Even if a perfectly uniform distribution cannot be achieved, the distribution is known by design, and so the transmission of the Projection Lens can be measured. By quasi-random we mean that the arrangement of the pinholes is not regular. The arrangement of the pinholes may for example resemble the appearance of items which have been sprinkled at random onto a surface.

In this way, a uniform source with sufficient intensity can be created to enable measurement of apodization of the projection lens.

The embodiments described allow measurement of the projection lens apodization, independent of the illuminator profile.

By applying the found lens apodization as a correction to pupil measurements, it may also be used to improve measurement of the intensity profile of the illuminator system.

While specific embodiments of the invention have been described above, it will be appreciated that the invention may be practiced otherwise than as described. The description is not intended to limit the invention.

What is claimed is:

1. A method of measuring apodization of projection optics for use in a lithographic apparatus, the projection optics having an object plane where, in use, a patterning device is located, a pupil plane, and an image plane where, in use, a substrate is located, the method comprising:

placing an aperture in said object plane to create a substantially uniform radiation distribution;

illuminating the aperture in said object plane;

measuring an intensity distribution at a plane which is conjugate to the pupil plane in order to calculate the apodization of the projection optics;

placing an aperture at the image plane of said projection optics to create a substantially uniform radiation distribution;

placing a sensor behind said aperture at the image plane seen from the projection optics in a plane out of focus with respect to the image plane of said projection optics; and calibrating the angular sensitivity of said sensor.

2. A method as claimed in claim 1, wherein said aperture at the image plane is an array of apertures.

3. A method as claimed in claim 1, wherein the aperture at the image plane has a diameter smaller than the wavelength of radiation used.

4. A method as claimed in claim 1, further comprising calibrating the intensity profile of radiation emitted from the aperture at the object plane.

5. A method as claimed in claim 1, further comprising diffusing radiation reaching the aperture at the object plane.

6. Apparatus for measuring an optical characteristic of projection optics for use in a lithographic apparatus, the projection optics having an object plane where, in use, a patterning device is located, a pupil plane, and an image plane where, in use, a substrate is located, the apparatus comprising:

an aperture locatable or located in said object Plane, the aperture configured to create a substantially uniform radiation distribution;

a sensor configured to measure an intensity distribution of illumination from the aperture at a plane which is conjugate to the pupil plane to determine the optical characteristic of the projection optics based on the measured intensity distribution: and an aperture locatable or located between the projection optics and the sensor to calibrate the angular sensitivity of the sensor.

7. Apparatus as claimed in claim 6, wherein said plane which is conjugate to the pupil plane corresponds to a plane which is out-of-focus with respect to the image plane such that a far field imaging condition applies with respect to said pupil plane.

8. Apparatus as claimed in claim 6, wherein said aperture between the projection optics and the sensor is an array of apertures.

9. Apparatus as claimed in claim 8, wherein the array of apertures are arranged in a quasi-random or random manner.

10. Apparatus as claimed in claim 6, wherein the aperture between the projection optics and the sensor has a diameter smaller than the wavelength of radiation used.

11. Apparatus as claimed in claim 6, wherein the aperture at the object plane has a diameter approximately equal to the wavelength of the radiation used.

12. Apparatus as claimed in claim 6, wherein the aperture at the object plane has a diameter greater than the wavelength of the radiation used.

13. Apparatus as claimed in claim 6, wherein the intensity profile of radiation emitted from the aperture at the object plane is calibrated.

14. Apparatus as claimed in claim 6, further comprising a diffuser over the aperture at the object plane to diffuse the radiation reaching the aperture.

15. A lithographic apparatus comprising:

an illumination system configured to condition a beam of radiation;

a support structure configured to support a patterning device, the patterning device serving to impart the projection beam with a pattern in its cross-section;

a substrate table configured to hold a substrate;

projection optics configured to project the patterned beam onto a target portion of the substrate and having an object plane, where, in use, the patterning device is located, a pupil plane, and an image plane where, in use, the substrate is located;

an aperture locatable or located in said object plane, the aperture configured to create a substantially uniform radiation distribution;

a sensor configured to measure the intensity distribution at a plane which is conjugate to the pupil plane to determine an optical characteristic of the projection optics based on the measured intensity distribution; and an aperture locatable or located between the projection optics and the sensor to calibrate the angular sensitivity of the sensor.

16. An apparatus as claimed in claim 15, wherein said plane which is conjugate to the pupil plane corresponds to a plane which is out-of-focus with respect to the image plane such that a far field imaging condition applies with respect to said pupil plane.

17. An apparatus as claimed in claim 15, wherein said aperture between the projection optics and the sensor is an array of apertures.

18. An apparatus as claimed in claim 15, wherein the aperture between the projection optics and the sensor has a diameter smaller than the wavelength of radiation used.

19. An apparatus as claimed in claim 15, wherein the intensity profile of radiation emitted from the aperture at the object plane is calibrated.

20. Apparatus as claimed in claim 15, further comprising a diffuser over the aperture at the object plane to diffuse the radiation reaching the aperture.

* * * * *